United States Patent
Zheng

(10) Patent No.: US 9,213,794 B2
(45) Date of Patent: Dec. 15, 2015

(54) SYSTEM AND METHOD FOR ROUTING BUFFERED INTERCONNECTS IN AN INTEGRATED CIRCUIT

(71) Applicant: Nvidia Corporation, Santa Clara, CA (US)

(72) Inventor: Weiyi Zheng, Santa Clara, CA (US)

(73) Assignee: Nvidia Corporation, Santa Clara, CA (US)

( * ) Notice: Subject to any disclaimer, the term of this patent is extended or adjusted under 35 U.S.C. 154(b) by 41 days.

(21) Appl. No.: 14/170,195

(22) Filed: Jan. 31, 2014

(65) Prior Publication Data

US 2015/0220675 A1    Aug. 6, 2015

(51) Int. Cl.
*G06F 17/50*    (2006.01)

(52) U.S. Cl.
CPC ........ *G06F 17/5077* (2013.01); *G06F 17/5081* (2013.01)

(58) Field of Classification Search
CPC .................................................... G06F 17/5077
USPC .......................................................... 716/126
See application file for complete search history.

(56) References Cited

U.S. PATENT DOCUMENTS 6,130,550 A * 10/2000 Zaliznyak et al. .............. 326/39

* cited by examiner

*Primary Examiner* — Thuan Do

(57) ABSTRACT

A system and method for routing a buffered interconnect in an IC from a source cell to a target cell thereof. In one embodiment, the system includes: (1) a path tracer operable to designate the source cell as a current node and construct a path toward the target node by: (1a) defining a boundary about the current node based on a buffer driving length, (1b) trimming the boundary by any blockage therein to yield a candidate area for placing a buffer, (1c) dividing the boundary into line segments, (1d) selecting a closest, valid one of the line segments to the target cell as the current node and (1e) repeating the defining, trimming, dividing and selecting the closest, valid one until the current node lies within the buffer driving length and (2) a buffer placer associated with the path tracer and operable to select a location along the path to place the buffer.

20 Claims, 5 Drawing Sheets

SYSTEM AND METHOD FOR ROUTING BUFFERED INTERCONNECTS IN AN INTEGRATED CIRCUIT

TECHNICAL FIELD

Figure 1A:
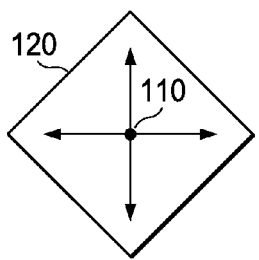

This application is directed, in general, to integrated circuit (IC) layout and, more specifically, to a system and method for routing buffered interconnects in an IC.

BACKGROUND

Electronic design automation (EDA) tools, a category of computer aided design (CAD) tools, are used by electronic circuit designers to create representations of circuit configurations, including representations of cells (e.g., transistors) and the interconnects they drive. EDA tools allow designers to construct a circuit and simulate its performance using a computer and without requiring the costly and lengthy process of fabrication. EDA tools are indispensable for designing modern, very-large-scale integrated circuits (VSLICs). For this reason, EDA tools are in wide use.

During an initial, "design," stage, circuit designers employ one or more EDA tools to create a logical representation of a desired electronic circuit. After becoming satisfied (typically through simulation) that the logical representation of the circuit operates as intended, the circuit designers then employ EDA tools called "IC compilers" (ICCs) to transform the logical representation (typically embodied in a "netlist") automatically into a corresponding physical representation of each cell (sometimes called a "macro") in the circuit on one or more photolithography masks in an "implementation" stage. The implementation stage typically includes two substages: a "placement" substage in which cells are placed relative to one another in circuit layers of an area representing a substrate which will support the cell, and a "routing" substage in which interconnects are routed in interconnect layers among the cells to yield a cohesive IC. Photolithography masks may then be made and used to fabricate layers of IC features on substrates and thereby form the ICs themselves.

Clock planning is typically carried out after the logical representation is defined. In clock planning, a clock tree is created to drive clock ports of each partition defined in the IC. Buffers are placed in the clock tree such that paths to the clock ports are minimized.

SUMMARY

One aspect provides a system for routing a buffered interconnect in an IC from a source cell to a target cell thereof. In one embodiment, the system includes: (1) a path tracer operable to designate the source cell as a current node and construct a path toward the target node by: (1a) defining a boundary about the current node based on a buffer driving length, (1b) trimming the boundary by any blockage therein to yield a candidate area for placing a buffer, (1c) dividing the boundary into line segments, (1d) selecting a closest, valid one of the line segments to the target cell as the current node and (1e) repeating the defining, trimming, dividing and selecting the closest, valid one until the current node lies within the buffer driving length and (2) a buffer placer associated with the path tracer and operable to select a location along the path to place the buffer.

Another aspect provides a method of routing a buffered interconnect in an IC from a source cell to a target cell thereof. In one embodiment, the method includes: (1) designating the source cell as a current node, (2) constructing a path toward the target node, including: (2a) defining a boundary about the current node based on a buffer driving length, (2b) trimming the boundary by any blockage therein to yield a candidate area for placing a buffer, (2c) dividing the boundary into line segments, (2d) selecting a closest, valid one of the line segments to the target cell as the current node and (2e) repeating the constructing until the current node lies within the buffer driving length and (3) selecting a location along the path to place the buffer.

Yet another aspect provides an IC having a buffered interconnect routed from a source cell to a target cell therein by a process. In one embodiment, the process includes: (1) designating the source cell as a current node, (2) constructing a path toward the target node, including: (2a) defining a boundary about the current node based on a buffer driving length, (2b) trimming the boundary by any blockage therein to yield a candidate area for placing a buffer, (2c) dividing the boundary into line segments, (2d) selecting a closest, valid one of the line segments to the target cell as the current node and (2e) repeating the constructing until the current node lies within the buffer driving length and (3) selecting a location along the path to place the buffer.

BRIEF DESCRIPTION

Figure 1B:
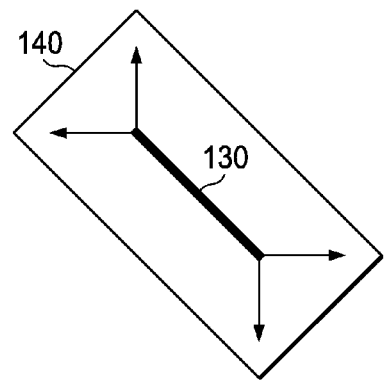
Figure 3:
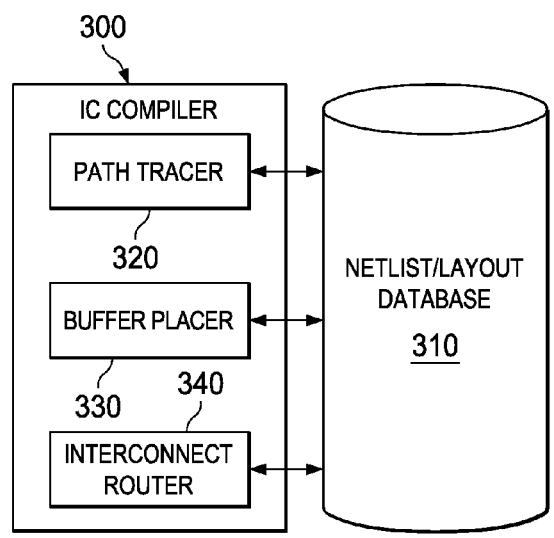
Figure 4:
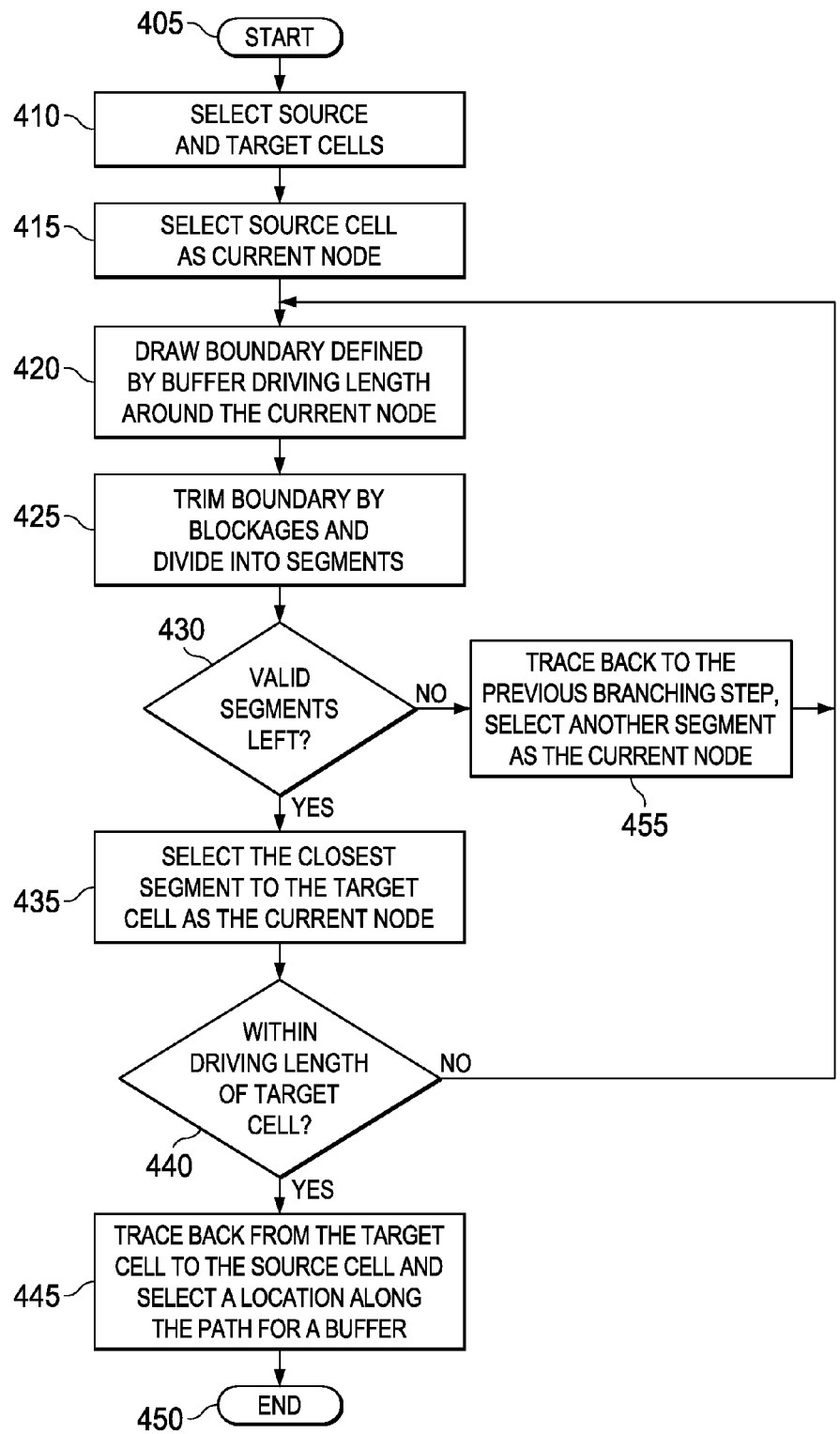

Reference is now made to the following descriptions taken in conjunction with the accompanying drawings, in which:

FIGS. 1A and 1B are diagrams respectively illustrating expansions of a point and a line segment;

FIGS. 2A-F are diagrams illustrating the routing of a buffered interconnect;

FIG. 3 is a block diagram of one embodiment of a system for routing a buffered interconnect in an IC; and FIG. 4 is a flow diagram of one embodiment of a method of routing a buffered interconnect in an IC.

DETAILED DESCRIPTION

As stated above, the routing of interconnects is part of the overall implementation of an IC design. As those skilled in the pertinent art know, interconnects exceeding a certain length (determined at least in part by their cross-sectional area, operating voltage, operating frequency and acceptable operating margins) require buffers along their length to drive the signals they transmit to maintain their integrity. Particularly long buffered interconnects (such as those found in a clock tree) may need many buffers.

Modern routing tools route interconnects and place the buffers they contain at the same time. Because the buffers are themselves circuitry, they must be placed in circuit layers, where the cells have also been placed. Thus, modern routing tools relegate both the buffers and the interconnects to areas between the cells. Because the cells almost always block diagonal routing, modern routing tools are constrained to taxicab geometry, in which buffered interconnects span Manhattan distances between the cells they interconnect. Conventional routing techniques designed to operate in taxicab geometry are based on Dijskra's pathing algorithm or the A* pathing algorithm. The buffers themselves also require certain minimum areas, further constraining the routing of buffered interconnects and forcing them to take circuitous routes. This increases the power they consume and delays the signals they convey.

It is realized herein that while buffers need to be placed in the circuit layers, the interconnects are not; they are routed in the overlying interconnect layers. It is therefore realized herein that the cells, which block the placement of buffers, should not constrain the routing of the interconnects. It is still further realized herein that the areas required by the buffers can and should be taken into account in determining the routing of the interconnects. Accordingly, it is realized herein that a novel routing technique based on such areas could be advantageous.

Accordingly, introduced herein are various embodiments of a system and method for routing buffered interconnects in an IC. The embodiments introduce a novel routing technique that takes the area of buffers into account, appropriately placing such buffers with respect to already-placed cells, but not unduly constraining the routing of the interconnects spanning the buffers. Certain embodiments of the system and method result in buffered interconnects of reduced length and thus reduced power consumption and signal delay.

FIGS. 1A and 1B are diagrams respectively illustrating the defining of a boundary about a point node and a line segment node. As will be described in some context below, the system and method described herein involve defining a boundary about a current node based on a buffer driving length. It will be recalled that interconnects exceeding a certain length require buffers along their length to drive the signals they transmit to maintain their integrity. Buffers have a known driving strength, which determines the length of the interconnect that they can drive (assuming, of course, that the characteristics of the interconnect are known). In the present context, the characteristics of the interconnect are such that a selected buffer is able to drive signals reliably up to a maximum driving length. This buffer driving length is employed to define the boundary about the current node.

The current node may be a point 110 as illustrated in FIG. 1A or a line segment 130 as illustrated in FIG. 1B. In the case of the point 110 of FIG. 1A, the boundary 130 corresponding to the current node is a square. In the case of the line segment 130 of FIG. 1B, the boundary 140 corresponding to the current node is a rectangle. In the embodiments of FIGS. 1A and 1B, the buffer driving length extends from the node 110, 130 to the corners of the boundary 120, 140, as unreferenced arrows illustrate. Thus, the area of the square or rectangular boundaries 120, 140, lie within the buffer driving length.

Figure 2A:
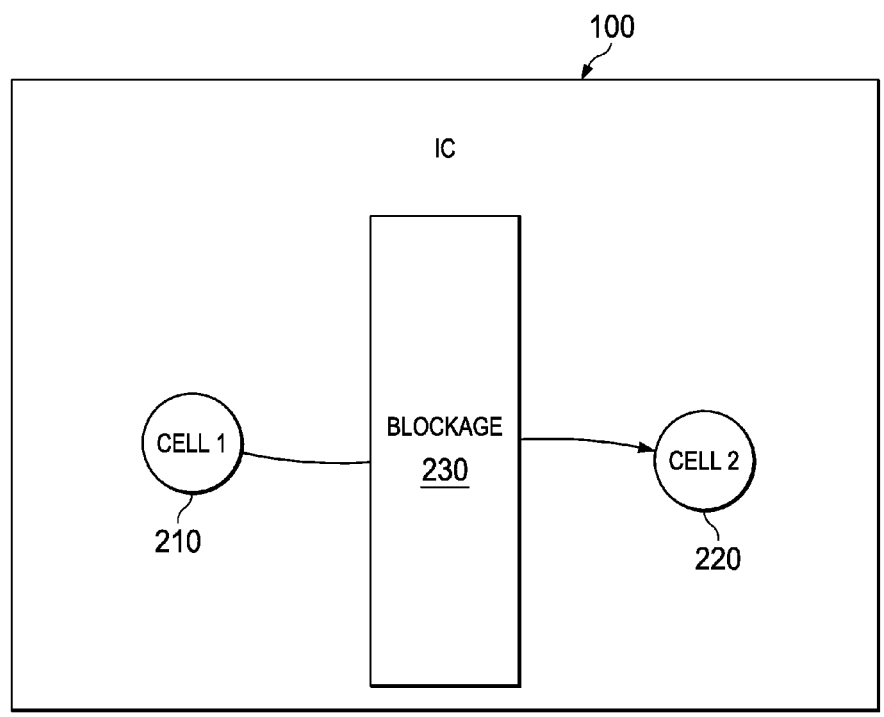

FIGS. 2A-F are diagrams illustrating the routing of a buffered interconnect in an IC 100. FIG. 2A shows a source cell 210, a target cell 220 and another cell or other blockage 230 that prevents buffers from being placed within it. FIG. 2A also shows an unreferenced logical path from the source cell 210 to the target cell 220. The logical path may bear a control signal, a data signal or a clock signal. Unfortunately, as FIG. 2A shows, the logical path crosses the blockage 230, which prevents it from being transformed into a direct physical path from the source cell 210 to the target cell 220. Accordingly, the system and method disclosed herein may be employed to route a buffered interconnect between the source cell 210 to the target cell 220 but around the blockage 230 that serves as the physical path therebetween.

Figure 2B:
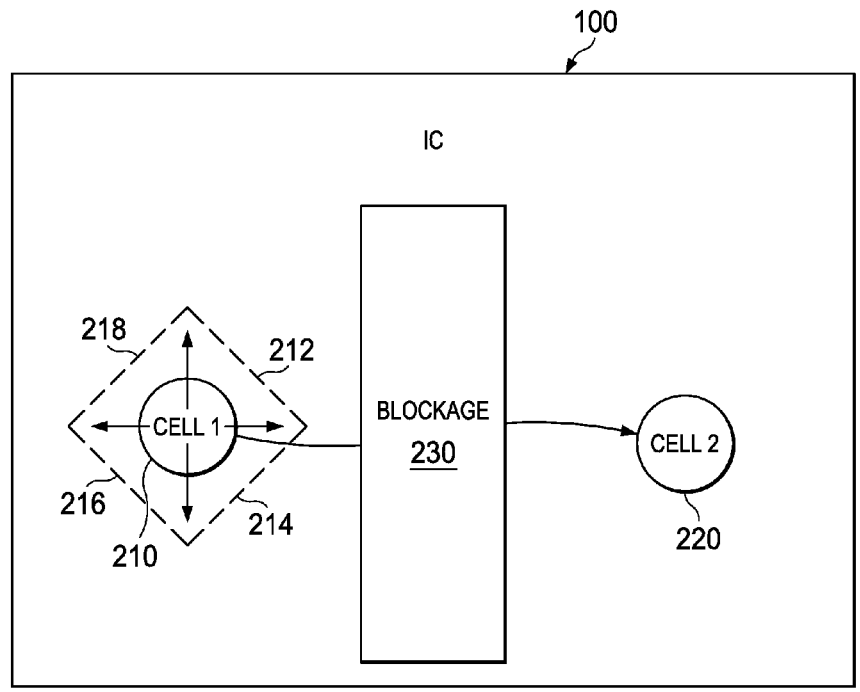

FIG. 2B shows a first iteration in the routing of the buffered interconnect. The source cell (210 of FIG. 2A) is selected to be a current node, and a boundary is defined about the current node using the buffer driving length to determine its size. In FIG. 2B, the boundary is square and characterized by four segments 212, 214, 216, 218.

Figure 2C:
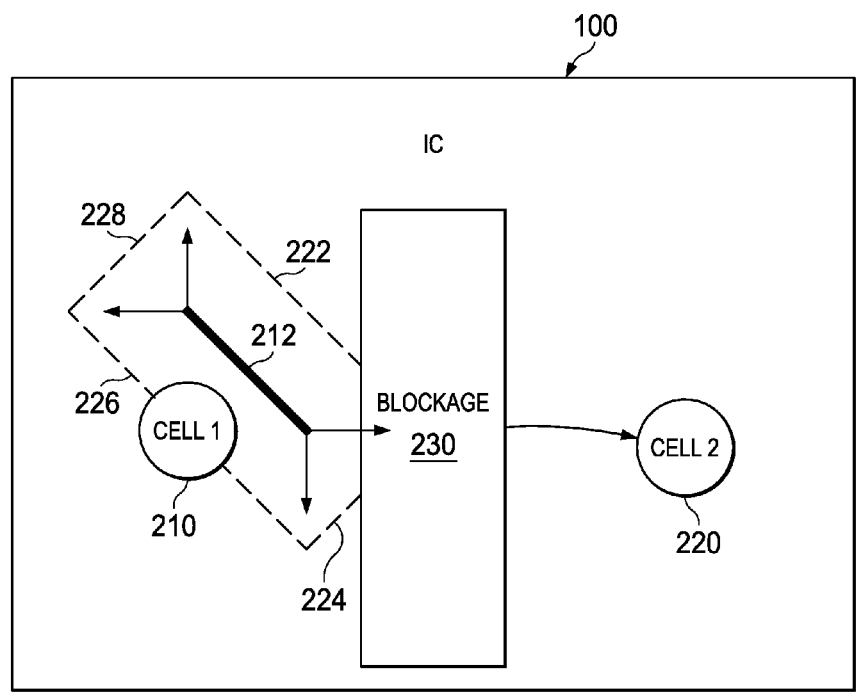

FIG. 2C shows a next iteration in the routing of the buffered interconnect. The segment closest to the target cell 220, which happens to be the segment 212, is selected to be the current node. Again, a boundary is defined about the current node using the buffer driving length to determine its size. In FIG. 2C, the boundary is rectangular and characterized by four segments 222, 224, 226, 228. The blockage 230 interferes with the boundary, so the segments 222, 224 are trimmed accordingly.

Figure 2D:
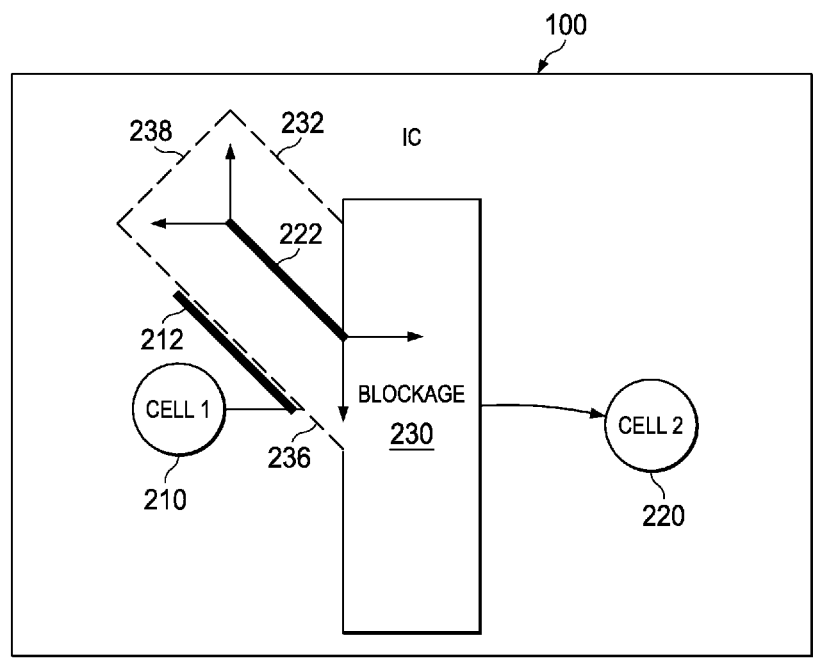

FIG. 2D shows a next iteration in the routing of the buffered interconnect. The segment closest to the target cell 220, which happens to be the segment 222, is selected to be the current node. Again, a boundary is defined about the current node using the buffer driving length to determine its size. In FIG. 2D, the boundary is rectangular and characterized by three illustrated segments 232, 236, 238 and one unshown segment lying wholly within the blockage 230. The blockage 230 interferes with the boundary, so the segments 232, 236 are trimmed accordingly.

Figure 2E:
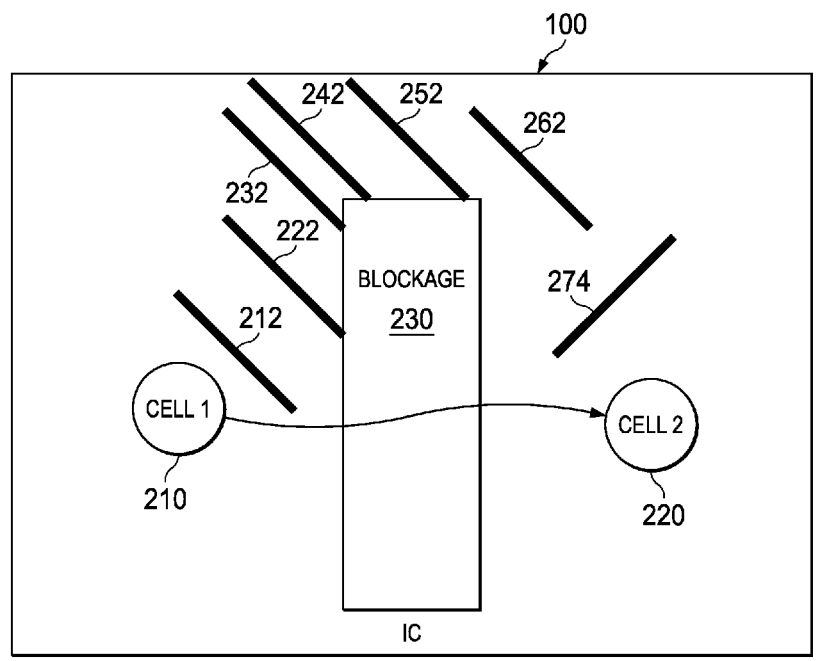

FIG. 2E shows the result of several further iterations in the routing of the buffered interconnect. As a consequence of the further iterations, segments 242, 252, 262, 274 have been defined in addition to the segments 212, 222 that were defined in the iterations described above. The source cell 210 and the segments 212, 222, 242, 252, 262, 274 all lie within a buffer driving lengths of one another. Further, the segment 274 lies within a buffer driving length of the target cell 220. Buffers may now be placed, and interconnects may now be routed among the buffers to complete the buffered interconnect.

Figure 2F:
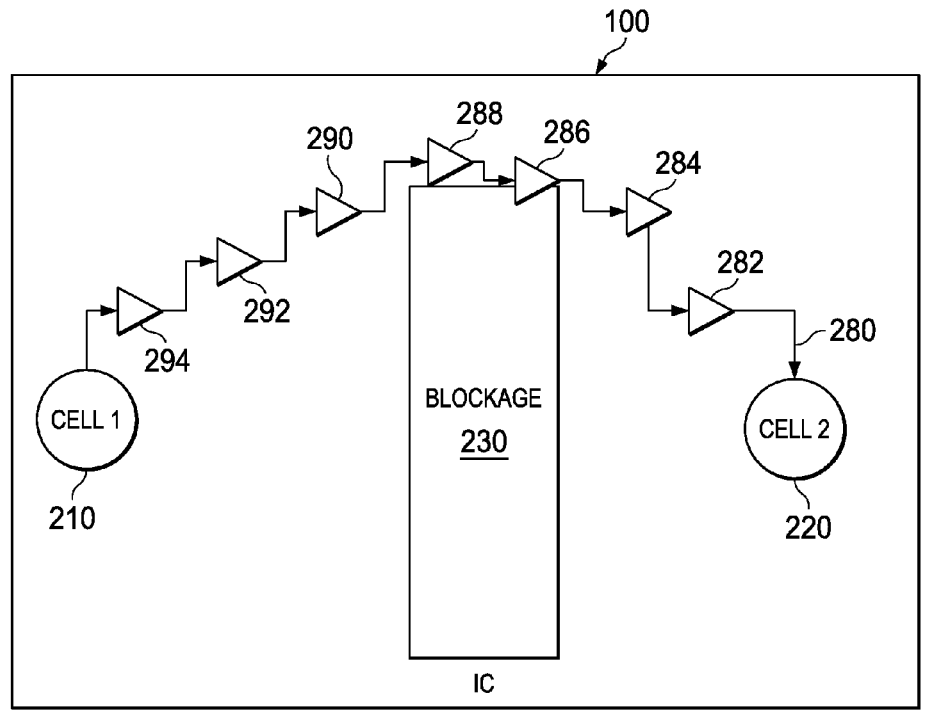

FIG. 2F illustrates buffers 282, 284, 286, 288, 290, 292, 294. The buffers have been placed in order from the target cell 220 to the source cell 210. Interconnects (shown, but not referenced for clarity's sake) are then routed between the source cell 210 and the target cell 220 and through the buffers 282, 284, 286, 288, 290, 292, 294 to interconnect the same. The buffered interconnect has now been routed in the IC 100.

FIG. 3 is a block diagram of one embodiment of a system for routing a buffered interconnect in an IC. As stated in the Background above, an ICC is employed to transform a netlist, which is the logical representation of an IC into a layout that then can be transformed into photolithography masks, which may then be employed to fabricate ICs. Accordingly, FIG. 3 shows an ICC 300 that interacts with at least one netlist/layout database 310 that stores the netlist and at least part of the layout. Typically after cells have been placed in the layout, the ICC 300 is tasked with routing buffered interconnects.

The ICC 300 includes a path tracer 320. In the illustrated embodiment, the path tracer 320 is operable to designate the source cell as a current node and construct a path toward the target node iteratively. In a given iteration, the path tracer 320 is operable to define a boundary about the current node based on a buffer driving length, trim the boundary by any blockage therein to yield a candidate area for placing a buffer, divide the boundary into line segments and select a closest, valid one of the line segments to the target cell as the current node. The path tracer 320 is further operable to repeating the defining, trimming, dividing and selecting the closest, valid one until the current node lies within the buffer driving length. The ICC 300 further includes a buffer placer 330. In the illustrated embodiment, the buffer placer 330 is operable to select a location along the path to place the buffers called for by the path tracer 320. The ICC 300 further includes an interconnect router 340. In the illustrated embodiment, the interconnect router is operable to route an interconnect from the source node to the target node through the buffers called for by the path tracer 320 and placed by the buffer placer 330. A more complete layout results from this process, and is stored in the at least one netlist/layout database 310.

FIG. 4 is a flow diagram of one embodiment of a method of routing a buffered interconnect in an IC. The method begins in a start step 405. In a step 410, source and target cells are selected. In a step 415, the source cell is selected to be a current node. In a step 420, a boundary is defined about the current node by buffer driving length. Since the source cell is regarded as a point, the boundary takes the form of a square. In a step 425, the boundary is trimmed by any blockages and divided into segments. In a decisional step 430, it is determined whether or not any valid segments are left after the boundary has been divided. If valid segments are left, a step 435 is carried out. In the step 435, the segment that is closest to the target cell is selected to be the current node. In a decisional step 440, it is determined whether or not the current node is within a driving length of the target cell. If not, the step 420 is carried out again. If the current node is within a driving length of the target cell, a step 445 is carried out. In the step 445, the path from the source cell to the target cell is traced back from the target cell, and at least one location along the path is selected for placing a buffer. One or more buffers are then placed within buffer driving lengths of one another until all buffers the path requires are placed. Interconnects are then routed between the source and target cells and through the buffers in the path to interconnect the same. The method ends in an end step 450. If, as a result of the decisional step 430, no valid segments are left after the boundary has been divided, a step 455 is carried out. In the step 455, the path from the source cell to the current node is traced back to a previous node, another valid segment of that previous node is selected as the current node, and the step 420 is carried out again. In one embodiment, the previous node is the immediately previous node.

Those skilled in the art to which this application relates will appreciate that other and further additions, deletions, substitutions and modifications may be made to the described embodiments.

What is claimed is:

1. A system for routing a buffered interconnect in an integrated circuit from a source cell to a target cell thereof, comprising:
   a path tracer operable to designate said source cell as a current node and construct a path toward said target node by:
      defining a boundary about said current node based on a buffer driving length,
      trimming said boundary by any blockage therein to yield a candidate area for placing a buffer,
      dividing said boundary into line segments,
      selecting a closest, valid one of said line segments to said target cell as said current node, and
      repeating said defining, trimming, dividing and selecting said closest, valid one until said current node lies within said buffer driving length; and
   a buffer placer associated with said path tracer and operable to select a location along said path to place said buffer.

2. The system as recited in claim 1 wherein said boundary corresponding to said source node is a square.

3. The system as recited in claim 1 wherein said boundaries of said line segments are rectangles.

4. The system as recited in claim 1 wherein said path is associated with a clock tree of said integrated circuit.

5. The system as recited in claim 1 further comprising an interconnect router associated with said buffer placer and operable to route an interconnect from said source node to said target node through said buffer.

6. The system as recited in claim 1 wherein said path tracer is further operable to construct said path by selecting further locations along said path to place further buffers.

7. The system as recited in claim 1 wherein said path tracer is further operable to construct said path by:
   if no valid line segments remain:
   selecting a previous node as said current node, and
   selecting another valid one of said line segments of said current node.

8. A method of routing a buffered interconnect in an integrated circuit from a source cell to a target cell thereof, comprising:
   designating said source cell as a current node;
   constructing a path toward said target node, including:
      defining a boundary about said current node based on a buffer driving length,
      trimming said boundary by any blockage therein to yield a candidate area for placing a buffer,
      dividing said boundary into line segments,
      selecting a closest, valid one of said line segments to said target cell as said current node, and
      repeating said constructing until said current node lies within said buffer driving length; and
   selecting a location along said path to place said buffer, wherein said designating, said constructing and said selecting a location are performed by an integrated circuit compiler.

9. The method as recited in claim 8 wherein said boundary corresponding to said source node is a square.

10. The method as recited in claim 8 wherein said boundaries of said line segments are rectangles.

11. The method as recited in claim 8 wherein said path is associated with a clock tree of said integrated circuit.

12. The method as recited in claim 8 further comprising routing an interconnect from said source node to said target node through said buffer.

13. The method as recited in claim 8 further comprising selecting further locations along said path to place further buffers.

14. The method as recited in claim 8 wherein said constructing further includes:
   if no valid line segments remain:
   selecting a previous node as said current node, and
   selecting another valid one of said line segments of said current node.

15. An integrated circuit having a buffered interconnect routed from a source cell to a target cell therein by a process comprising:
   designating said source cell as a current node;
   constructing a path toward said target node, including:
      defining a boundary about said current node based on a buffer driving length,
      trimming said boundary by any blockage therein to yield a candidate area for placing a buffer,
      dividing said boundary into line segments,
      selecting a closest, valid one of said line segments to said target cell as said current node, and
      repeating said constructing until said current node lies within said buffer driving length; and
   selecting a location along said path to place said buffer.

16. The process as recited in claim 15 wherein said boundary corresponding to said source node is a square and said boundaries of said line segments are rectangles.

17. The process as recited in claim 16 wherein said buffered interconnect is part of a clock tree of said integrated circuit.

18. The process as recited in claim 16 further comprising routing an interconnect from said source node to said target node through said buffer to yield said buffered interconnect.

19. The process as recited in claim 16 further comprising selecting further locations along said path to place further buffers.

20. The process as recited in claim 16 wherein said constructing further includes:
   if no valid line segments remain:
   selecting a previous node as said current node, and
   selecting another valid one of said line segments of said current node.

* * * * *